United States Patent [19]
Ayers et al.

[11] Patent Number: 5,772,106
[45] Date of Patent: Jun. 30, 1998

[54] PRINTHEAD FOR LIQUID METALS AND METHOD OF USE

[75] Inventors: Scott D. Ayers, Richardson; Donald J. Hayes, Plano; Michael T. Boldman, Murphy; David B. Wallace, Dallas, all of Tex.

[73] Assignee: MicroFab Technologies, Inc., Plano, Tex.

[21] Appl. No.: 581,273

[22] Filed: Dec. 29, 1995

[51] Int. Cl.⁶ .................................................... B23K 3/06
[52] U.S. Cl. ........................... 228/254; 222/590; 427/422
[58] Field of Search .............................. 228/180.22, 254; 222/593, 590; 219/74; 427/422, 427

[56] References Cited

U.S. PATENT DOCUMENTS

| | | | |
|---|---|---|---|
| 3,683,212 | 8/1972 | Zoltan | 310/8.3 |
| 3,832,579 | 8/1974 | Arndt | 310/8.1 |
| 4,250,373 | 2/1981 | Tanida | 219/74 |
| 4,418,354 | 11/1983 | Perduijn | 346/140 |
| 4,527,038 | 7/1985 | Cuny et al. | 219/74 |
| 4,527,717 | 7/1985 | Emoto et al. | 222/593 |
| 4,558,381 | 12/1985 | Bergmanns | 360/77 |
| 4,828,886 | 5/1989 | Hieber | 427/422 |
| 5,053,100 | 10/1991 | Hayes et al. | 156/294 |
| 5,092,864 | 3/1992 | Hayes et al. | 606/10 |
| 5,193,738 | 3/1993 | Hayes | 228/180.2 |
| 5,229,016 | 7/1993 | Hayes et al. | 222/590 |
| 5,377,902 | 1/1995 | Hayes | 228/180.22 X |
| 5,377,961 | 1/1995 | Smith et al. | 222/590 X |
| 5,411,602 | 5/1995 | Hayes | 148/23 |
| 5,415,679 | 5/1995 | Wallace | 222/590 X |

Primary Examiner—Kenneth J. Ramsey
Attorney, Agent, or Firm—Locke Purnell; Rain Harrell

[57] ABSTRACT

A compact printhead assembly is designed for employment in a soldering operation without the need for fluxes and without conducting the operation in a confined chamber. A self-contained printhead assembly has an internal reservoir and internal heating elements for raising the temperature above the melting temperature of solder or other liquid to be dispensed in microdroplets from a working surface at one end of the printhead housing. A jetting device containing an electro-mechanical transducer is pulsed to produced droplets at an exit orifice located at the working surface. Inert gas is preheated by the housing and delivered to the working surface to establish an oxygen-free atmosphere around the exit orifice and between the working surface and a substrate located a working distance away, whereby microdrops can be formed and deposited without harmful oxidation.

31 Claims, 8 Drawing Sheets

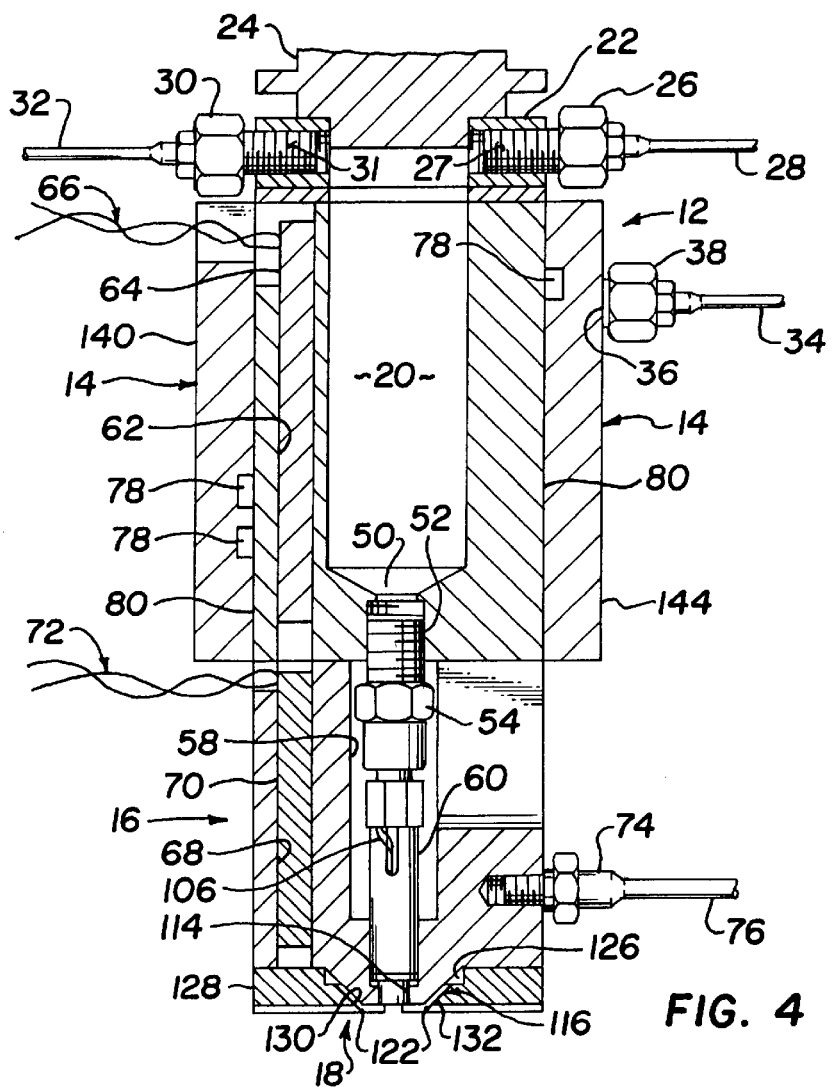
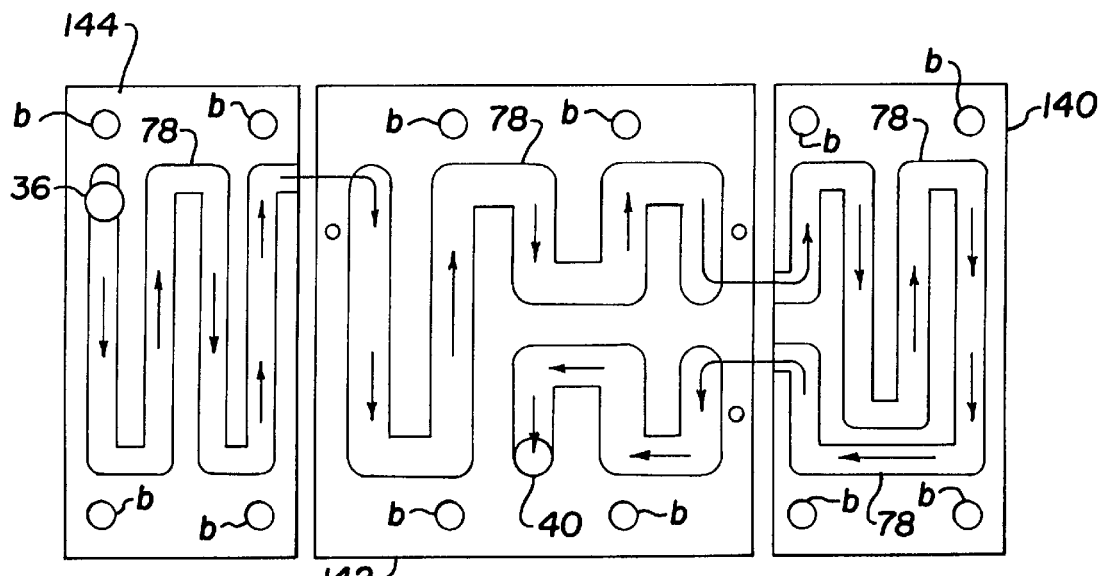
FIG. 4
FIG. 5B

PRINTHEAD FOR LIQUID METALS AND METHOD OF USE

FIELD OF THE INVENTION

The invention relates generally to the dispensing of liquid metals, more particularly to methods and apparatus for producing droplets of melted solder and applying them to a substrate workpiece in a soldering operation without confining the entire workpiece in an inert atmosphere chamber.

BACKGROUND OF THE INVENTION

The high density electronic manufacturing process requires the dispensing of very small solder balls to very small soldering areas. Semiconductor integrated circuit chips are bonded to substrate by a solder reflow process. Interconnects between the terminals on the substrate and the chip are in the form of solder bumps prior to the solder reflow process. Conventional processes for making these interconnections are discussed in U.S. Pat. Nos. 5,229,016 and 5,193,738, the disclosures of which are incorporated by reference herein. The former patent discloses a method and apparatus for dispensing spherical-shaped quantities of liquid solder to a predetermined location. It emphasizes the detrimental affect of oxidation and impurities on the formation of spherical droplets and wetting of the surface on which the solder balls are deposited. The latter disclosure discusses the need to use solvents or fluxes in one form or another to clean and free surfaces to be bonded from oxides and promote bonding. After the soldering process, it discloses that the conventional process equipment requires an additional step of removing flux residue with a solvent or solvents.

As more compact arrays of solder pads are required by the industry, smaller spherical-shaped drops of liquid solder are desired and these are more difficult to produce and control unless extremely low oxygen concentration is provided in the area where the drops are formed and deposited. It is desirable to use no flux or solvents for soldering. Conventional equipment is complicated and requires too much space. It is difficult to maintain the required inert atmosphere unless the process is carried out in a confined area, such as a chamber. A compact printhead assembly to make solder bumps or connections without confinement is needed.

SUMMARY OF THE INVENTION

The invention is a compact printhead assembly and method of operation. Except for supply connections and electrical connections, it is a stand alone unit which contains all of the elements necessary to controllably dispense fluids which melt at elevated temperature. The printhead is especially designed to operate with solder alloys in a microsoldering operation for microelectronic devices on a substrate, without confinement in a controlled atmosphere chamber. The printhead is configured to eject liquid solder droplets and deposit them onto a workpiece substrate through a controlled atmosphere produced by the printhead assembly in cooperation with the substrate. A controlled inert atmosphere is produced by the printhead over a range of gaps between a working surface at one end of the printhead assembly and a workpiece spaced a working distance apart. The atmosphere thus produced is sufficient to inhibit oxidation of the ejected fluid in the gap so that solder droplets can be formed and deposited on the substrate without the use of a flux material or the necessity of cleaning or otherwise removing the flux after soldering is completed. The printhead assembly is well suited for fluxless solder deposition.

The printhead assembly comprises a heated housing having a reservoir for holding melted solder, a lower end having a working surface and heating means within. The housing has an upper portion and a lower portion wherein the reservoir is mostly in the upper portion. An internal cavity in the housing extends from the reservoir through the lower portion of the housing to the working surface. A solder jetting device is positioned within the internal cavity of the lower portion of the housing.

The jetting device is adapted to controllably eject droplets of melted liquid solder received from the reservoir in the housing and direct them from the working surface to a substrate. The jetting device comprises an electromechanical transducer, such as a piezoelectric transducer or a similar device in contact with an elongated conduit having its inlet end in communication with the melted solder in the reservoir and a tip at an outlet end having a fine exit orifice positioned adjacent the working surface and configured to emit solder droplets outwardly away from the working surface.

The housing includes a means for uniformly distributing a flow of inert gas around the exit orifice. Said gas flows radially outwardly from the working surface, traversing a gap established between the working surface and a workpiece when the printhead is positioned for soldering use a working distance over a workpiece substrate in order to provide a sufficient protective inert atmosphere around solder droplets emitted from the exit orifice by the jetting device to permit solder deposition without damaging oxidation. The upper housing has a closure and a connection means for pressurized inert gas or vacuum leading into a space above the reservoir. The inert gas prevents oxidation and crusting of the upper surface of molten metal in the reservoir as well as serving as a variable to adjust the formation of solder microdroplets at the tip. The vacuum can be used for drawing melted solder out of the tip and conduit back into the reservoir during a cool down phase after operation in order to facilitate start up and prevent damage due to freezing of the solder.

The upper portion of the housing also includes a means for preheating inert gas which is to be preheated and then transferred at a low flow rate to the means for uniformly distributing a flow of inert gas around the exit orifice. The means for preheating inert gas includes a supply inlet and a lengthy tortuous path in thermal transfer contact with the housing through which the inert gas must pass while flowing between the supply inlet and an outlet leading to the means for distributing inert gas around the exit orifice. Said means comprise one or more plates having an inner surface in contact with the outer surface of the upper housing and a serpentine groove located between said inner and outer surfaces which comprises the tortuous path.

The elongated conduit of the jetting device extends longitudinally within the housing in generally right angle relationship with the working surface at the lower end of the printhead. The working surface extends radially a sufficient distance in all directions from the exit orifice to confine a blanket of inert gas, provided by the means for uniformly distributing a flow of inert gas around the exit orifice, when the working surface is positioned a working distance from a workpiece substrate whereby solder deposition can take place without damaging oxidation.

An annular opening spaced uniformly around the exit orifice at the working surface, is used to discharge said flow of inert gas provided by the preheating means. Behind the annular opening is a cone shape formation which establishes an annular chamber provided with an internal opening leading to an inlet connection for supplying the inert gas from the preheating means. The cone shaped formation preferably comprises a cap with an inner cone surface which fits over a corresponding cone surface on the lower end of the housing wherein a flat circular shaped surface at the outer end of the cone surface formed on the housing and an opening of the cap which surrounds the flat circular shaped surface jointly form the annular opening and chamber. The outwardly facing surfaces of the flat circular shaped surface and the cap comprise respectively first and second portions of the working surface. The second portion of the working surface may extend a slight distance beyond the first portion of the working surface with the exit orifice positioned even with the level of the first portion of the working surface.

The means for uniformly distributing the flow of inert gas around the exit orifice may comprise at least first and second concentric annular openings spaced uniformly around the exit orifice at the working surface and through which said inert gas is discharged. The first and second annular openings are respectively spaced a first and second radial distance from the exit orifice, where the second distance is greater than the first. This permits the same or a different inert gas to be distributed at the same or a different flow rate from each annular opening.

The jetting device preferably comprises a piezoelectric transducer in a tubular configuration which surrounds a portion of the conduit and is in contact with the conduit. The piezoelectric transducer is driven by voltage pulses provided by drive electronics in a programmable controller with a signal having a magnitude, pulse shape, and frequency adapted to produce spherical microdrops of solder from the exit orifice of a desired size and frequency. A biasing voltage can be applied to a piezoelectric transducer which is helpful to reduce the tendency for depositing and/or aging because of use at an elevated temperature or higher temperature versions of piezoelectric materials may be selected for use with conventional solders.

BRIEF DESCRIPTION OF THE DRAWINGS

FIG. 4 is a partial cross sectional view of the printhead assembly in elevation along the lines 4—4 from FIG. 2;

FIG. 5B is the jacket assembly of FIG. 5A as it would appear when it is laid out on a surface to illustrate the tortuous path followed by the inert gas;

DETAILED DESCRIPTION

Figure 1:
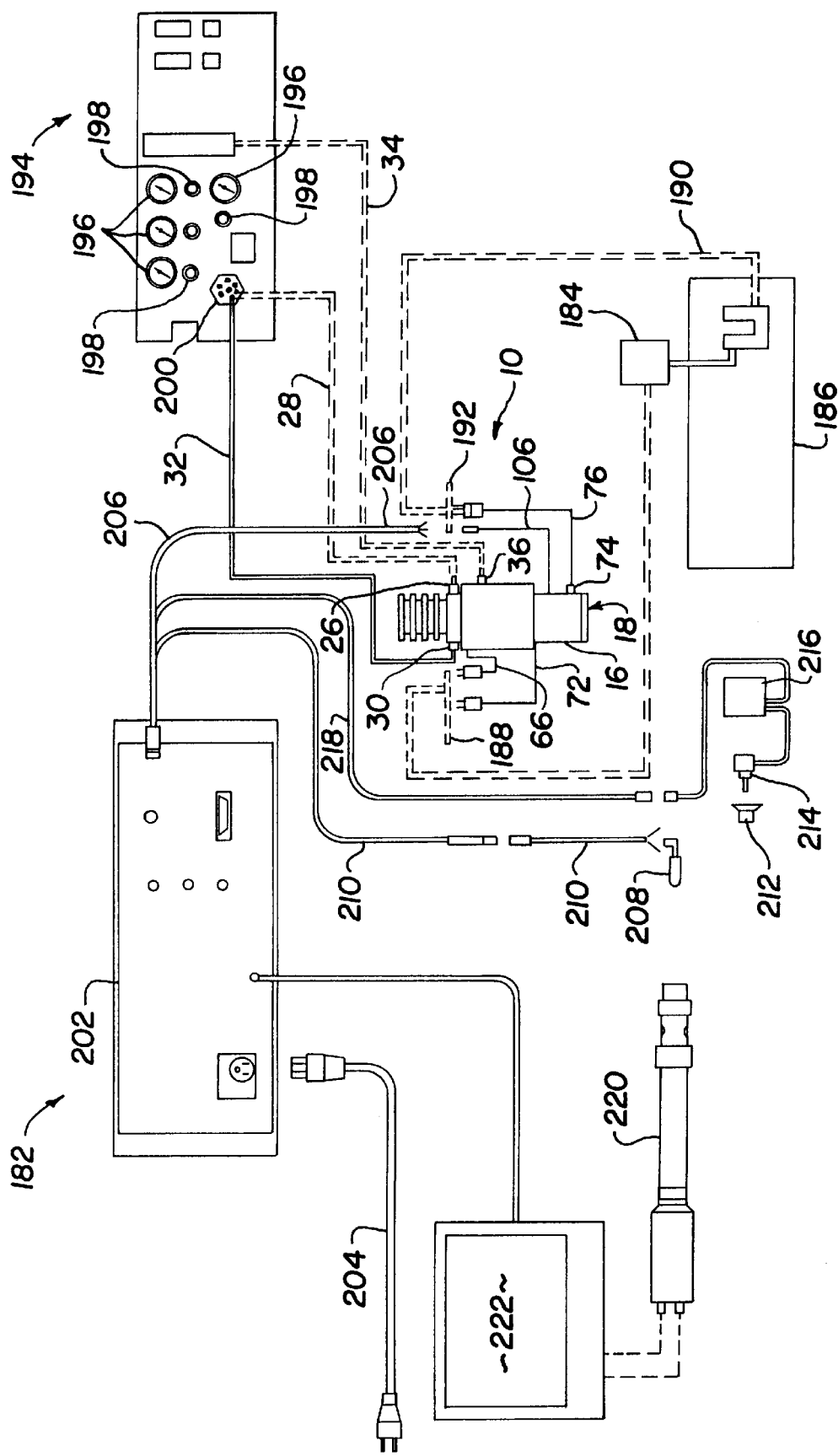
FIG. 1 is a schematic diagram showing a layout of conventional components which are used to supply and operate the novel printhead assembly.

The following detailed description in connection with the accompanying drawings discloses a presently preferred embodiment of the invention wherein like reference numerals have been applied to like elements.

Figure 2:
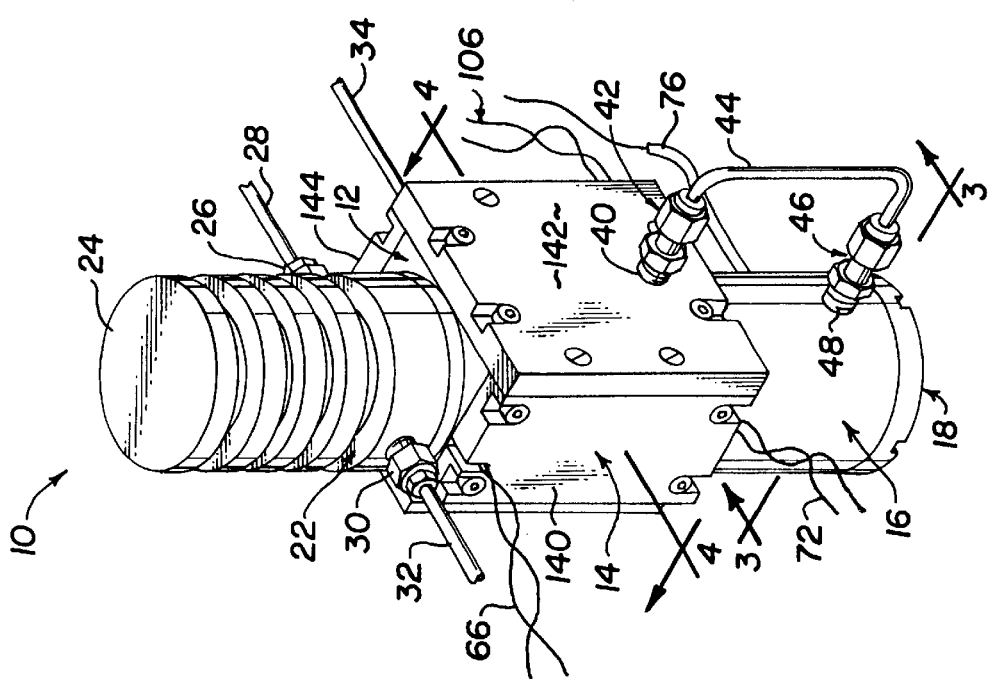
FIG. 2 is a perspective elevational view of the printhead assembly.

In FIG. 2 the printhead assembly is seen in its entirety, generally referred to by reference numeral 10. Printhead assembly 10 has a heated housing comprising an upper housing portion 12 with a jacket generally designated 14 and a lower housing portion 16. The housing portions may be separate parts bolted together with bolts not shown in the drawings. Printhead assembly 10 has a lower end having a working surface 18 from which liquid solder droplets in the form of small spherical drops are emitted. Upper housing 12 contains a reservoir 20 for melted solder better seen in FIG. 4. The upper end 22 of upper housing 12 is sealed by a closure which is cap 24. Cap 24 is preferably non-metallic and removable for loading solder into reservoir 20. The upper portion of upper housing 12 has connection means 26 for inert gas supply line 28 from a controllable source of inert gas. Connection means 30 is connected to vacuum line 32 running to a source of vacuum. Jacket 14 has connected thereto an inert gas line 34 from a controllable source of inert gas. Jacket 14 has a supply inlet 36 and connection 38 connected to inert gas supply line 34 as best seen in FIG. 4. Jacket 14 has an outlet 40 with a connection means 42 and a line 44 seen in FIGS. 2 and 3 which transfers inert gas from line 34 through connection 46 to an inlet 48 of a means for uniformly distributing a flow of inert gas around an exit orifice.

Referring now to FIG. 4, upper housing portion 12 is open at the top when cap 24 is removed for loading solder into centrally located reservoir 20. Reservoir 20 has an opening 50 at the bottom leading into threaded passage 52 at the bottom of upper housing 12. A threaded fitting 54 having an internal passageway 56 leading to opening 50 is threaded into passage 52. A longitudinally extending internal cavity 58 is centrally located within lower housing 16, extending throughout lower housing 16 to working surface 18. Internal cavity 58 provides sufficient room for fitting 54 and a solder jetting device 60.

The housing of printhead assembly 10 is heated in order to melt and hold solder and solder alloys in reservoir 20 at a working temperature above the melting temperature. Upper housing 12 has a longitudinally extending space 62 for an electrical rod heater 64 having power supply conduit 66 extending through an opening in the housing and connected to a suitable power source. Lower housing 16 has a longitudinally extending space 68 occupied by electric rod heater 70 having power supply conduit 72 extending from an opening in the housing and connected to a suitable power source. One or more thermocouples 74 are connected through lead 76 to a controller that operates the heaters. These features enable the housing to be maintained at a suitable operating temperature above the melting point of the solder. FIG. 4 also shows a few portions of a serpentine groove 78 through which inert gas passes at an interface 80 of upper housing 12 and jacket 14.

Figure 3:
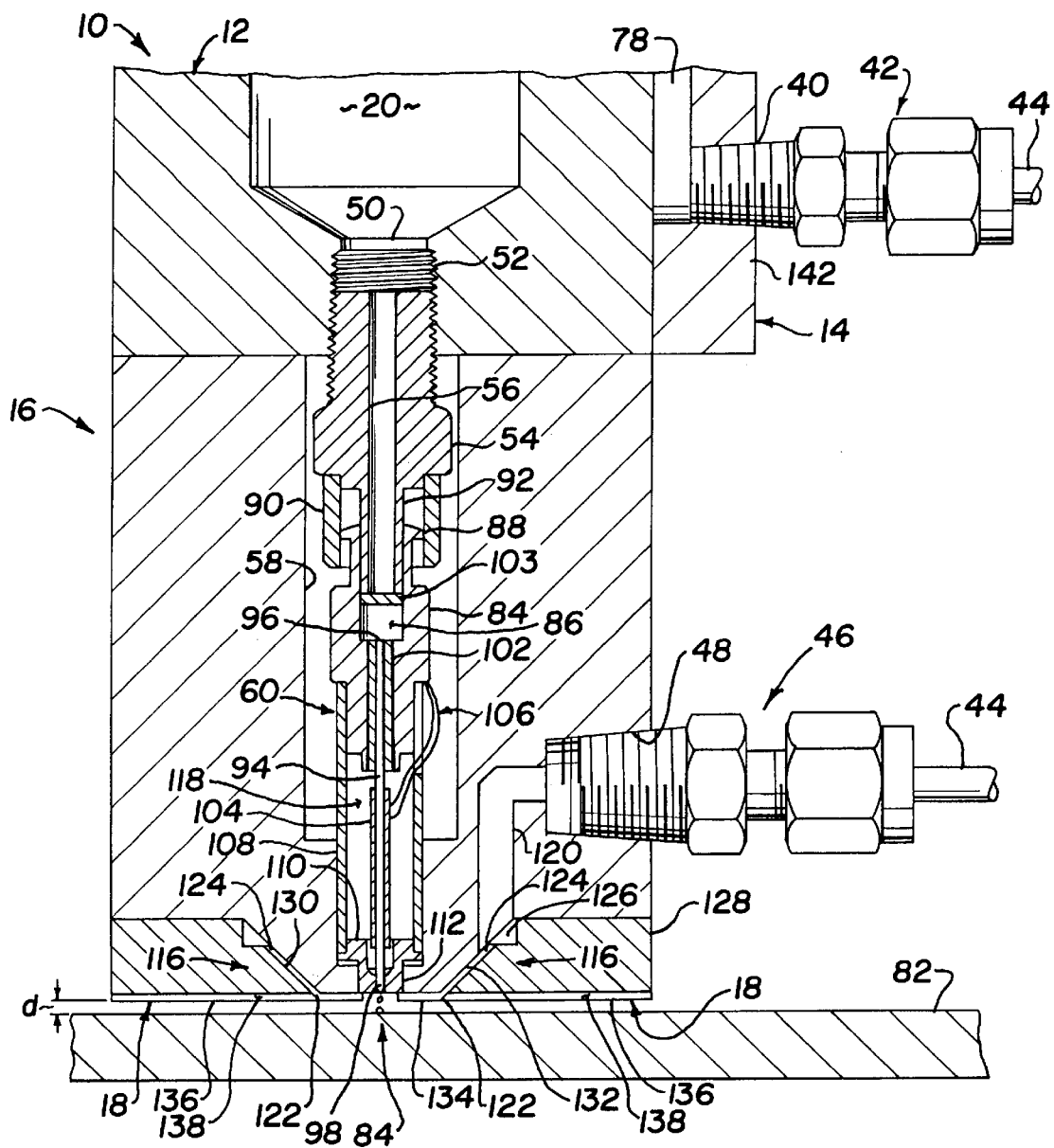
FIG. 3 is a partial cross section of the printhead assembly in elevation along the line 3—3 from FIG. 2.

More details of solder jetting device 60 and its relation to the lower housing portion 16 are shown in FIG. 3. In FIG. 3, printhead assembly 10 is shown in operating position with working surface 18 spaced a working distance or gap "d" above a workpiece 82 on which one or more or an array of solder droplets 84 are to be deposited to make solder bumps or solder connections. Solder jetting device 60 is positioned within internal cavity 58 of lower housing 16. Solder jetting device 60 has an upper connection end 84 having an opening into a space 86 and a luer fitting 88 at the upper end. Fitting 54 extends downwardly in cavity 58, having a lower connection end 90 containing complimentary engaging surfaces for connection of luer fitting 88 around a stem 92. Stem 92 provides a continuation of internal passageway 56 to space 86. It is contemplated that a conventional filter 103 can be interposed along the molten metal pathway for the purpose of removing undissolved foreign matter that might otherwise clog device 60. Lower housing 16 may be disconnected from upper housing 12 in order to remove, install or service jetting device 60.

Figure 6:
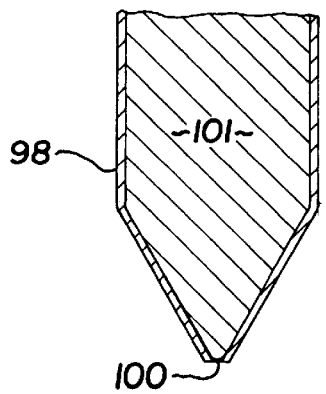
FIG. 6 is a schematic representation of the outlet end and exit orifice of the solder jetting device.

Jetting device 60 includes elongated conduit 94 having an inlet end 96 in communication with melted solder at space 86. Elongated conduit 94 has an outlet end 98 with exit orifice 100 best seen in FIG. 6, filled with melted solder 101 during operation, positioned adjacent to working surface 18. Approximately the upper one-third of elongated conduit 94 is supported by closely fitted sleeve 102. Most of the lower two-thirds of elongated conduit 94 is closely fitted with an electromechanical transducing device 104 having electrical operating leads 106. Leads 106 pass through an opening in a mounting shield 108 surrounding the preferred high temperature resistant piezoelectric transducer 104. Space 118 within shield 108 may be filled with electrical insulation in the form of "potting" material. Mounting shield 108 has an opening in its lower end capped by an end cap 110 comprising an end plug having a reduced diameter portion 112. Reduced diameter portion 112 is fitted into an opening 114 of a conical formation 116 centered at the bottom of lower housing 16. End cap 110 has an opening in its reduced diameter portion 112 which supports outlet end 98 of conduit 94 in sliding relation. Outlet end 98 is not rigidly held by end cap 110 so as to avoid interfering with acoustical waves generated by transducer 104 which generate melted solder droplets 84.

In the preferred embodiment, elongated conduit 94 is preferably an elongated glass tube drawn to a very fine exit opening which can be done according to the procedures of U.S. Pat. No. 5,053,100 which disclosure is incorporated herein by reference. Sleeve 102 is preferably a stainless steel sleeve having an internal diameter of about 29–30 thousands of an inch bonded with epoxy to conduit 94 having a maximum outer diameter of about 28 thousands of an inch. Other suitable materials could be substituted. The solder jetting device is preferably a piezoelectric transducer 104 in a tubular configuration surrounding and in contact with a portion of the outer surface of conduit 94. Device 60 is adapted to controllably eject tiny droplets of melted liquid solder received from the reservoir in the housing and direct them directly away from working surface 18 toward the surface of workpiece 82. It is within contemplation of the invention that the conduit 94 could be in two pieces partially separated by the body of a tubular transducer 104 wherein the liquid would come into contact and be carried by the inner surface of transducer 104 such that the tubular transducer itself could form part of the conduit. The diameter of the working surface 18 of the embodiment shown in the Figures was two inches and the other parts are generally to scale. This is the same diameter as the lower housing.

Printhead assembly 10 has a means for uniformly distributing the flow inert gas around the exit orifice whereby inert gas flows outwardly from the working surface 18 and creates, in cooperation with the surface of a workpiece 82, a virtually oxygen-free protective atmosphere around solder droplets 84 emitted from exit orifice 100 by jetting device 60 to permit deposition of spherical solder droplets at successive locations on the surface of a workpiece 82. In FIGS. 2 and 4, inert gas from line 44 traverses inlet 48 and feed line 120. This gas passes to an annular orifice 122 spaced radially uniformly around exit orifice 100 at the working surface when working surface 18 is spaced a working distance from workpiece 82.

The inert gas discharged around orifice 100 is slightly above atmospheric pressure causing it to flow radially outwardly from around the exit orifice through working gap "d" thereby scavenging any initial oxygen and preventing oxygen from entering from atmosphere around the printhead to the tip where solder droplets are being formed. The means for uniformly distributing the flow of inert gas from line 44 further comprises a cone-shaped formation 116 which establishes annular chamber 124 leading outwardly from feed line 120 to annular opening 122. The supply of inert gas preferably enters annular chamber 124 at a single entry point of an annular ring 126 at the rear of annular chamber 124. This configuration is designed to feed low velocity gas all around annular ring 126 through annular opening 122 without creating turbulence which would disturb solder droplets being formed.

Cone-shaped formation 116 preferably comprises a cap 128 having an inner cone surface 130 which fits over a corresponding conical surface 132 centered at the lower end of lower housing 16 and spaced apart to create annular chamber 124 and annular orifice 122. Conical surface 132 terminates at its lower end at a flat circular shaped surface 134 surrounding opening 114. The outer edge of flat circular surface 134 and the inner edge of a corresponding opening in cap 128 form annular discharge opening 122 at the lead lines thereof. Thus flat circular surface 134 and the lower surface 136 of cap 128 comprise respectively first and second portions of working surface 18. A plurality of shallow radially extending grooves 138 may be provided in surface 136 of end cap 128 to allow a camera to view drops 84. They create acceptable discontinuities in the radial flow. In the preferred embodiment there are four such radial paths 138 positioned around surface 136 of end cap 128, arranged at 90 degree intervals.

It is within contemplation of the invention that the means for uniformly distributing inert gas around the exit orifice may comprise at least first and second concentric annular openings spaced uniformly around the exit orifice at the working surface and supplied by a common or separate supply. The first and second annular openings may be spaced at first and second radial distances from the exit orifice where the second distance is greater than the first. The same or different inert gases could thus be distributed at the same or a different flow rate from each of the annular orifices and balanced to minimize turbulances and oxygen concentration that could cause damaging oxidation of solder droplets. Other means that may be used to distribute inert gas around the exit orifice include a porous plate or a plate having a pattern of tiny openings at the working surface and a chamber behind the openings in the plate supplied with inert gas. Structures which produce a pattern of gas jets around the exit orifice as well as a single annular orifice are contemplated. Care should be taken that gas flow is balanced to avoid turbulence which might affect drop formation and trajectory. The annular orifice or orifices are preferably round although it is contemplated that other polygonal shaped orifices could be employed.

Figure 7:
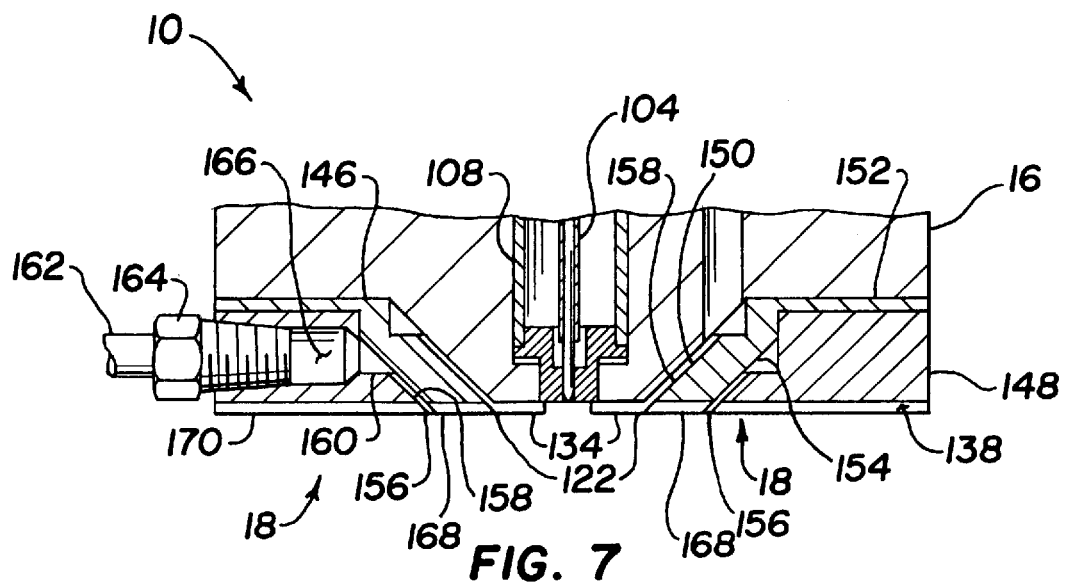
FIG. 7 is a partial cross sectional view like FIG. 3 of an alternate inert gas distribution system having two concentric gas discharge orifices.

FIG. 7 illustrates an adaptation of printhead assembly 10 with dual concentric orifices comprising a first annular orifice 122 at a first radial distance from the exit orifice, and a second annular orifice 156 at a second radial distance from said exit orifice greater than said first distance. In FIG. 7 the end cap is in two pieces comprising an inner ring 146 and a surrounding outer ring 148. Inner ring 146 has a conical shaped body 150 which has a laterally extending flange 152 coextensive with the periphery of lower housing 16. Body 150 has a second conical shaped surface 154 which will form the inside periphery of second outer annular orifice 156. Outer ring 148 has a corresponding conical shaped surface 158 which forms the outer periphery of annular opening 156 and a second annular chamber 160. Second annular chamber 160 is fed with inert gas from line 162 through connection means 164 and inlet opening 166. In this configuration, working surface 18 is composed of flat circular surface 134, a second flat circular surface 168 on inner ring 146 between orifices 122 and 156, and the lower surface 170 of outer ring 148 which extends to the outer periphery of lower housing 16. Fasteners secure the inner and outer rings to the housing. The radial groove 138 may be included to facilitate viewing drop formation.

Figure 5A:
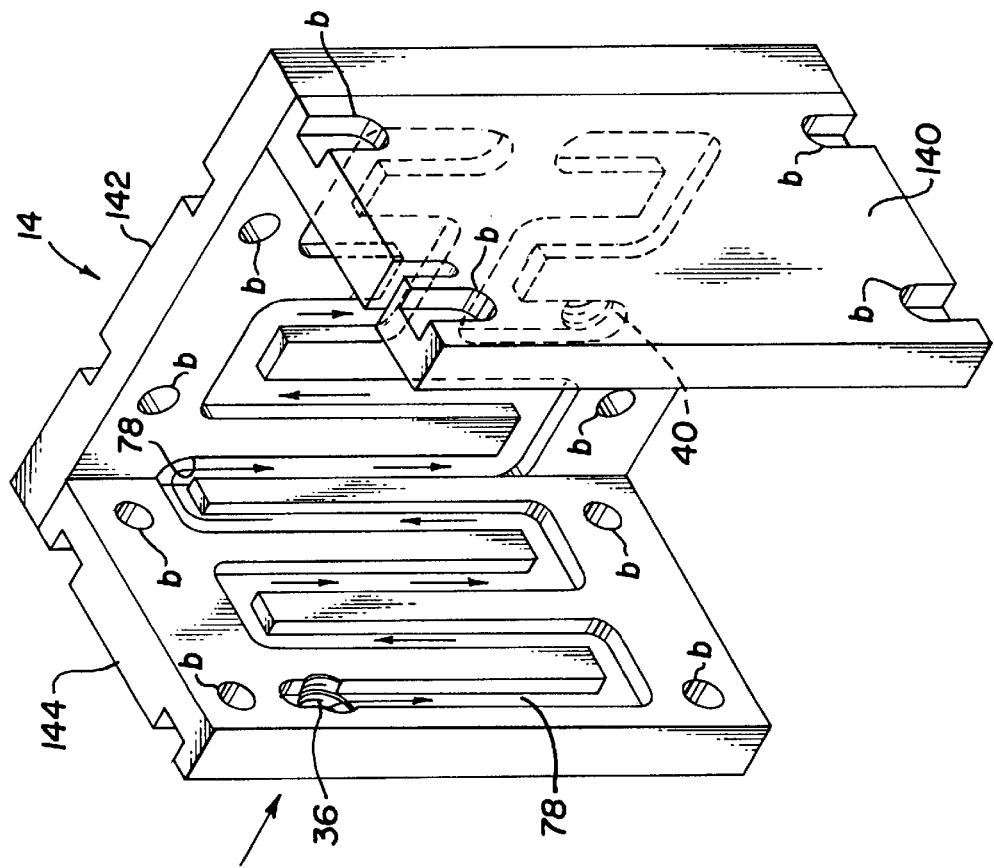
FIG. 5A is a perspective view of a jacket with an inert gas passageway which is bolted to the housing assembly of the printhead as shown in FIGS. 2–4.

Referring now to FIG. 5A, jacket 14 comprises opposed sidepieces 140 and 144 arranged at right angles to the side edges of a frontpiece 142. This forms a U-shaped box with flat inside surfaces which fit in close thermal contact with corresponding flat surfaces on the outer sides and front of upper housing 12 as shown in FIG. 2. The back of upper housing 12 opposite frontpiece 142 of jacket 14 is preferably used for mounting the printhead assembly either fixedly or movably for positioning over moving workpieces or robotically moving the printhead over fixed workpieces.

When jacket 14 is positioned around the outer surface of upper housing 12, gas flowing from line 34 through connection means 38 enters sidepiece 144 through opening 36, as indicated by the arrow in FIG. 5A. Inert gas entering inlet 36 travels in the direction of the arrows through a tortuous path comprising the inner surfaces of all three pieces 140, 142, 144 of jacket 14. After traversing said path the gas exits through exit 40, connection means 42 and line 44 where it travels to the means for distribution of inert gas around the exit orifice. The lengthy tortuous path comprises a serpentine groove 78 on the inside surfaces of each of the pieces 140–144. Sidepiece 144 is arranged in angular relation to frontpiece 142 wherein serpentine path 78 is carried to piece 142. Sidepiece 140 is similarly arranged in angular orientation with frontpiece 142 where matching grooves 78 create the tortuous path.

The tortuous path is better seen in FIG. 5B in which the sidepieces 140, 144 and frontpiece 142 are laid out to show the serpentine path extending from inlet 36 on plate 144 continuing across plate 142 to plate 140 are returning via co-located portions of serpentine groove 78 through outlet exit 40. FIGS. 5A and 5B show circular areas "b" which represent openings for bolts or screws which are used to fasten plates 140–144 to the opposite side and front outer surfaces of upper housing 12. Although the tortuous path is created by serpentine groove 78 formed on the inside surfaces of plates bolted to upper housing 12, it is evident that the same or a similar effect could be created by using flat plates 140–144 merely as covers for serpentine grooves formed underneath in the outer surfaces of upper housing 12. Since upper housing 12 must be heated by one or more internal heaters above the melting temperature of solder in reservoir 20, it is evident that jacket 14 provides a compact and efficient means for preheating inert gas and delivering the heated gas to the means for distributing inert gas around the exit orifice. This improves the operation of the device by reducing any tendency for cold inert gas to cause freezing or otherwise distort tiny solder balls being formed at the exit orifice. It provides a preheating system which does not need a separate control because it is controlled by the temperature of the housing and eliminates the need for a separate preheater.

Figure 8:
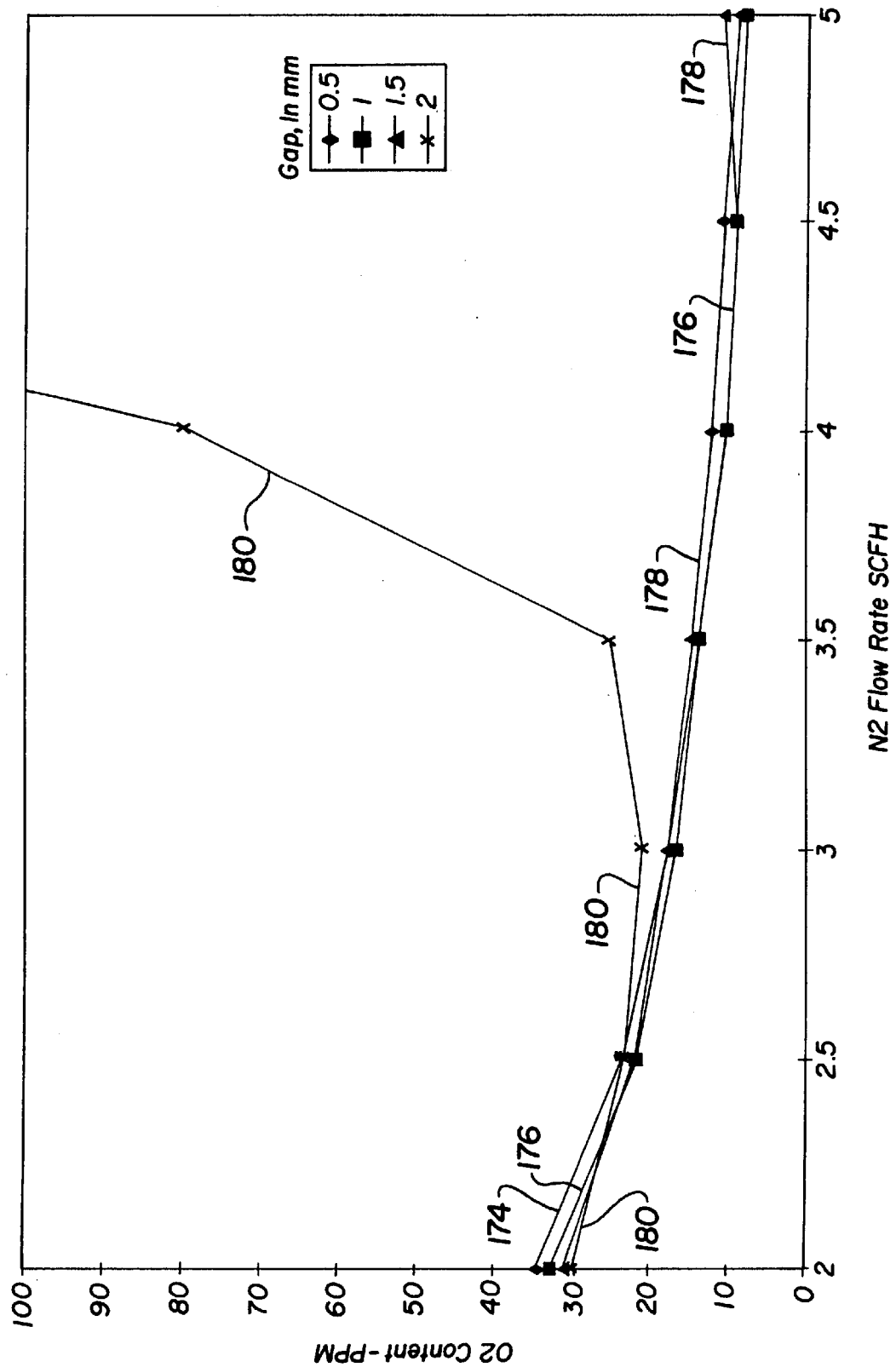
FIG. 8 is a graphical representation of how oxygen content varies with nitrogen flow rate and gap distance.

FIG. 8 is a representation to illustrate oxygen content within the gap "d" of the single orifice embodiment printhead disclosed in FIG. 3. The gap "d" is represented by four curves having a distance "d" in millimeters of 0.5, 1, 1.5 and 2 millimeters between working surface 18 and the substrate surface. Oxygen content is given in parts per million (PM) and the inert gas is nitrogen at various flow rates ranging from 2 to 5 standard cubic feet per hour (SCFH). The gaps 0.5, 1.0, 1.5 and 2.0 millimeters respectively are represented by reference numerals 174, 176, 178 and 180. The curves indicate that as nitrogen flow rate from orifice 122 increases, oxygen content trends downwardly, with very little difference between gaps ranging from 0.5 millimeters and 1.5 millimeters. Curve 180 illustrating a larger gap follows the same trend to a flow rate of about 3.5 SCFH where the oxygen content sharply rises with increased flow rate.

Bell jar experiments with printhead assembly 10 indicate 200 PPM was about the upper oxygen limit for operating solder jetting device 60 in drop on demand mode. Sometimes an irregular or continuous stream was produced at that oxygen level. It appears the higher oxygen concentration changes surface wetting characteristics at the tip by creating harmful oxidation which interferes with individual drop formation. Oxide is harmful to solder joint integrity. It appears that oxygen concentration of 100 PPM may be a safe useful upper limit for drop formation as well as solder joint integrity.

Figure 9:
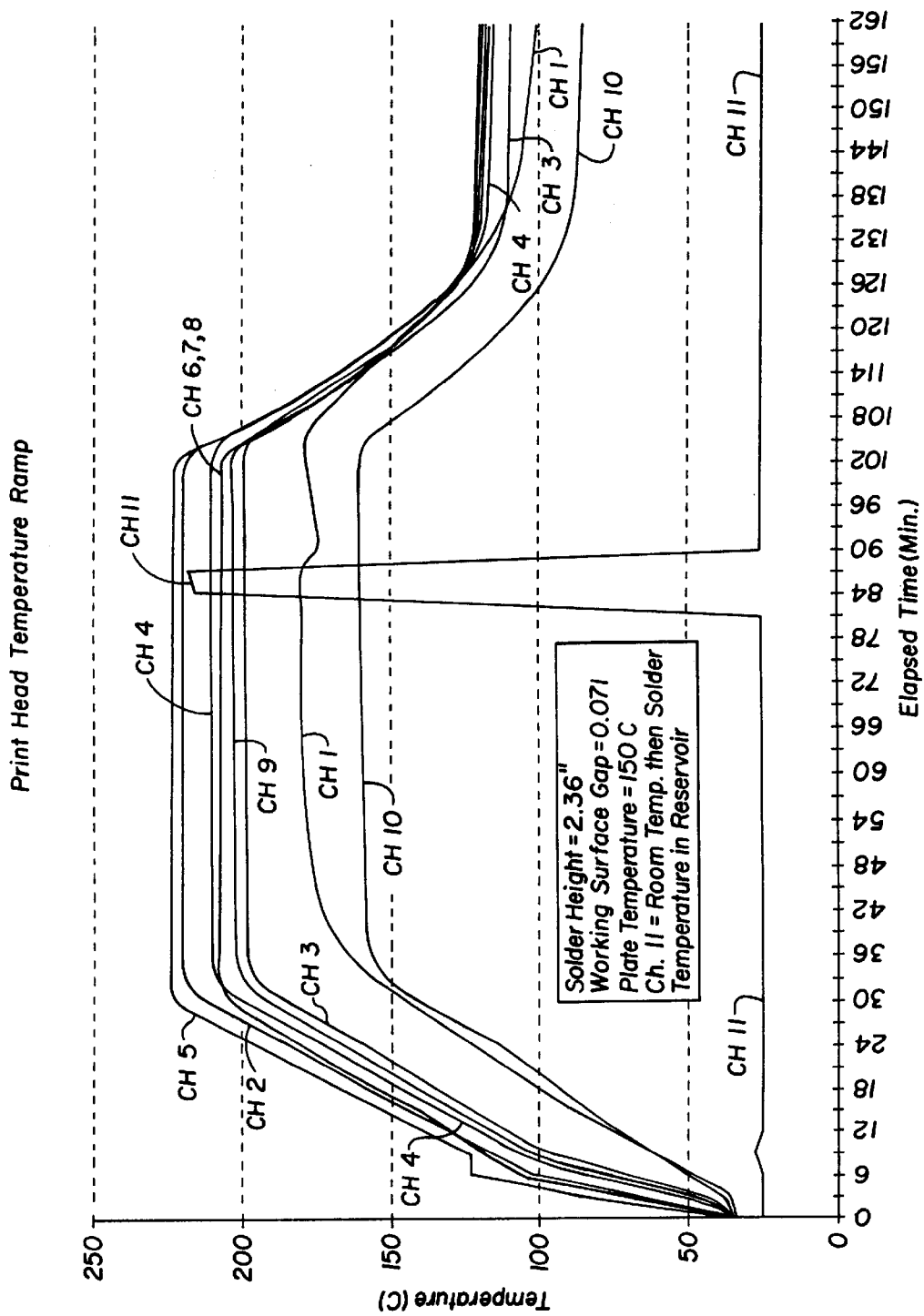
FIG. 9 is a graphical representation showing how temperature at different locations on the printhead assembly varies as temperature is ramped for operation.

FIG. 9 is a representation of temperature ramping of printhead assembly 10 during a typical heat up, operating and cool down cycle. Temperature in degrees C was measured by eleven thermocouples located at different places on the printhead assembly and plotted against time in minutes on a multi-channel recorder. Solder height in reservoir 20 was 2.36 inches and the gap was 0.071 inches over a plate substrate at 150° C. Channel 11 (Ch. 11) establishes a room temperature base and the solder temperature at one time interval. Ch. 1 was embedded in the round collar above jacket 14. Ch. 2 represented the temperature at the upper reservoir through frontpiece 142. Ch. 3 and 4 were mounted such that the sensor was exposed to gas in the tortuous path. Ch. 3 was the temperature of sidepiece 144 at inlet 36 and Ch. 4 an area of frontpiece 142 just above outlet 40. Ch. S was the temperature of sidepiece 140. Ch. 6 was the temperature of the end cap close to the exit orifice, Ch. 7 the end cap below rod heater 70 and Ch. 8 the side of lower housing 16 above end cap 128. Ch. 9 was the temperature within upper housing 12 near the lower part of reservoir 20 and Ch. 10 was the temperature of the mounting plate holding the printhead assembly. These temperatures indicate that temperature of the compact printhead assembly 10 was easily maintained within a reasonable variance above the melting temperature of solder.

FIG. 1 schematically shows a control and supply system generally designated by reference numeral 182 for printhead assembly 10. Conventional temperature controller 186, either directly or through a control rheostat or other control device 184, is electrically connected to interface 188 where controllable power is transferred through plugs to power supply conduit 66 of rod heater 64 and power supply conduit 72 leading to rod heater 70. Controller 186 is connected through leads 190 through interface 192 via a plug to leads 76 of thermocouple 74. Power supply to controller 186 is not shown.

A conventional inert gas and vacuum supply package box is represented by reference numeral 194, having gauges 196 and control knobs 198 arranged to controllably supply a desired inert gas or apply a vacuum to printhead assembly 10 via distributor 200. Inert gas is supplied through line 28 to connection means 26 and inlet 27. Inert gas is supplied through line 34 to connection means 38 and supply inlet 36. Vacuum is supplied through a line 32 to connection means 30 and inlet 31.

Programmable controller 202 represents control electronics for auxiliary apparatus and drive electronics contained therein. The output of the drive electronics provides activation signals which pulses solder jetting device 60 to eject a drop or drops (microdrops) of liquid solder 84 from exit orifice 100 and is controlled by the particular program in programmable controller as discussed in U.S. Pat. No. 5,299,016, the disclosure of which is incorporated herein by reference.

Programmable controller 202 is powered by cord 204 connected to a suitable power supply. Output signals from the drive electronics are transferred via conduit 206 through a plug which may pass through interface 192 to leads 106 of piezoelectric transducer 104 of solder jetting device 60 in lower housing 16. Aids to adjusting the output of solder jetting device 60 are preferably connected to programmable controller 202. They include a LED strobe light 208 representatively connected through leads 210. Knob 212 of potentiometer 214 and a selectable pre-set delay device 216 are representatively connected through leads 218 to controller 202. The strobe light is useful in generating a visual representation of droplets being formed at exit orifice 100 in cooperation with a suitable video camera 220 with a lenticular scale and television monitor 222. By adjusting the strobe light, repetitive microdrops of liquid solder from orifice 100 can be seen and with a known time delay provided by device 216, the distance traveled along a known scale makes it possible to calculate the velocity of the microdrops 84. Video equipment 220, 222 may have its own power and control boxes.

Solder jetting device 60 is adapted from ink jet technology. The construction and operation of devices like jetting device 60 are described in detail in U.S. Pat. Nos. 5,053,100, 5,092,864, and 3,683,212, the disclosures of which are hereby incorporated by reference. Such devices are typically excited with signals from drive electronics having a frequency typically less than about ten thousand (10,000) Hz. Solder jetting device 60 ejects liquid solder droplets in response to an excitation signal. Some additional problems occur when working in elevated temperatures with a hot liquid, such as melted solder, because of the tendency of depoling or accelerating aging in piezoelectric devices.

Piezoelectric transducers expand and contract mechanically when an electric field is applied. The type of motion (expansion or contraction) is dependent upon the polarity of the field. However, when piezoelectric materials are subject to temperatures even 100°–200° C. below the Curie temperature of the material, piezoelectric materials may lose their polarization. For many low temperature solder operating temperatures, a piezoelectric material with Curie temperature above 360° C. can be used without special precautions, but with higher melting temperature solders, it also suffers depolarization and aging. To avoid the above-described limitations, the piezoelectric transducer is poled when it is fabricated and, in operation, a biased voltage which creates an electric field is applied by the drive electronics in programmable controller 202. Once biased at the elevated potential, a drive voltage (also supplied by drive electronics within controller 202) is applied to cause transducer 104 to contract, thereby ejecting generally spherically-shaped molten droplets. Preferably, the magnitude of the drive voltage is less than or equal to the biased voltage. It should be noted that the drive voltage can be an impulse or a constant or a varying frequency waveform, such as a sinusoidal waveform.

Figure 10:
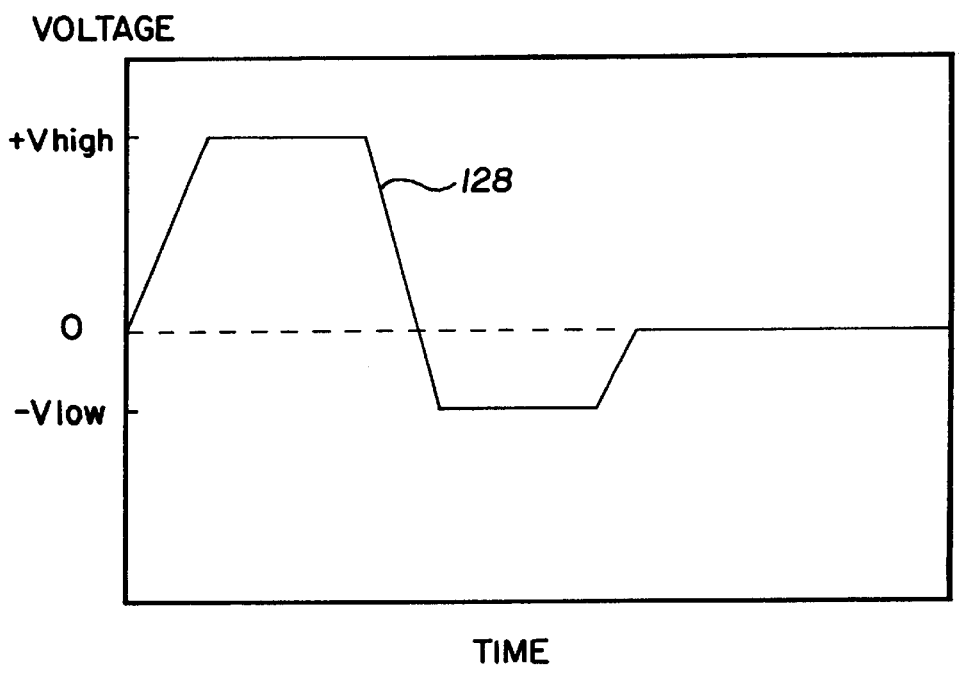
FIG. 10 is a representation of a conventional piezoelectric drive waveform.
Figure 11:
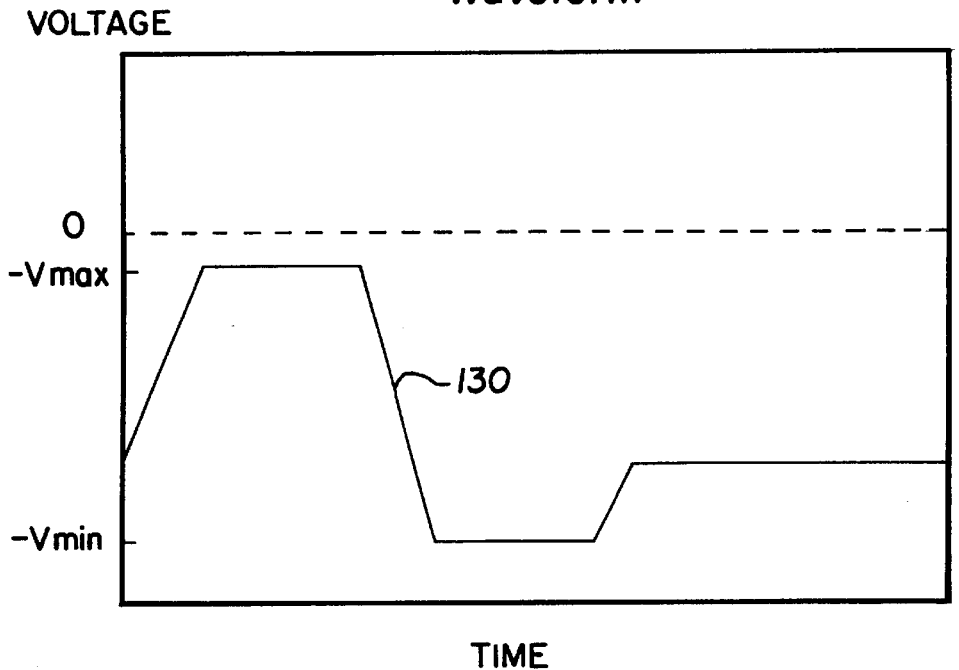
FIG. 11 is a representation of a biased piezoelectric drive waveform better suited to elevated temperature operation.

Examples of a conventional piezoelectric drive waveform 128 and a biased piezoelectric drive waveform 130 are illustrated in FIGS. 10 and 11. The graph in FIG. 10 illustrates how a conventional waveform causes the transducer to become depoled by modulating the voltage about a zero potential with a maximum voltage, Vhigh, and a minimum voltage, Vlow. As the voltage varies from Vhigh to Vlow and passes through the zero electric potential, the electric field polarity varies from a positive electric field to a negative electric field which causes the transducer to become depoled. By providing a biased voltage in the biased drive waveform and modulating the applied drive voltage about the biased voltage rather than the zero potential, the polarity of the applied electric field does not change. Instead, the polarity of the applied electric field remains constant. Small changes in diameter (and volume) of the solder droplets produced by device 60 generally require only changes in the drive excitation voltage pulse. Large changes generally require changes in the size of the orifice 100 in solder jetting device 60. The exit orifice 100 preferably has an opening of about 25 micrometers to about 100 micrometers.

The inert gas distributed to printhead assembly 10 is preferably nitrogen or argon and includes mixtures of these or similar inert gases or gas known as "forming" gas which may include a few percent hydrogen. The inert gas could include any gas that is essentially free of oxygen to an extent which prevents undesirable oxidation of hot solder.

A typical solder to be used with printhead assembly 10 is composed of about 63 percent tin and 37 percent lead which melts at about 183 degrees C. The apparatus has been demonstrated with pure indium. Printhead apparatus 10 is believed to be useful with alloys comprising at least two metals selected from the group comprising tin, bismuth, nickel, cobalt, cadmium, antimony, indium, lead, silver, gallium, aluminum, germanium, silicon and gold. It is sometimes helpful if the working substrate upon which the solder is deposited is heated within the range of from room temperature to about 150 degrees C. by any suitable means. Sometimes heating of the substrate can improve sticking of the solder to solder bumps or connections on the substrate and reduce a tendency for the tiny solder droplets to freeze prematurely.

In operation, printhead assembly 10 is connected as in FIG. 1 and in response to temperature controller 186 is ramped up as in FIG. 9 to an operating temperature above the melting point of the solder to be used. Closure 24 is removed and a charge of solder alloy placed in reservoir 20. After cap 24 is replaced, low pressure inert gas typically in the range of 1½–3 psig is introduced to reservoir 20 through line 28. This provides a blanket of inert gas to prevent crusting and is also adjustable to help drive solder down into the tip and exit orifice 100. If the pressure above the solder in reservoir 20 is too high, an undesirable blob of solder may form on the tip or it may result in creation of undesirable satellites instead of controllable microdrops of solder. If the pressure above the solder in reservoir 20 is too low, the meniscus may be too high in outlet end 98 such that operation of transducer 104 will produce no drops at all. Under certain conditions a negative pressure in the reservoir is desirable. This was seen with pure Indium solder. Thus, vacuum may also be used to control operation of the printhead.

Some adjustment of the variables is expected and it is preferable that the adjustment be made with the working surface 18 in close proximity a working distance from a substrate or a substrate substitute because virtual absence of oxygen is one of the variables which affects droplet formation. Close proximity to the substrate and an inert gas flow rate around 3.5 SCFH is preferred as indicated in FIG. 8. The variables include the inert gas pressure above the solder, the rate of co-flow inert gas around the exit orifice, the gap at the tip, the drive voltage applied to transducer 104, the particular solder alloy and the temperature of the printhead assembly. Typically the solder droplet velocity is approximately 1½ to 2 meters per second. Under conditions where the solder does not wet the substrate well, a lower velocity is required to avoid solder droplets from string and rebounding from the surface. Sometimes it is helpful to heat the substrate or reduce the velocity of the solder balls to get better wetting of the substrate surface. Increasing the voltage of the pulse to the transducer 104 generally increases the velocity.

Once device 60 is jetting properly, the magnifying video camera 220 in combination with strobe light 208 and monitor 222 can be adjusted to measure the velocity, observe droplet formation and make adjustments to get good wetting and sticking of the solder droplets to the substrate area to be soldered. After the set up is completed, the substrate to be soldered can be moved into position and manipulated in a conventional way by a programmed servo-mechanism which moves the substrate according to a programmed pattern in an "XY" plane to deposit individual or a plurality of droplets in particular locations on the substrate. Another approach would be to move the printhead relative to the substrate.

If it is desired to cool down printhead assembly 10, the supply of inert gas to reservoir 20 through line 28 is stopped and vacuum in the range of about 15 to 20 inches of mercury is introduced into line 32 until the solder freezes and maintained while the cool down in FIG. 9 is taking place. This prevents cracking or damage to the conduit.

Some examples of what has been done with the compact printhead assembly 10 are mentioned here based on actual trials. Drops of $63/37$ percent tin/lead of 60 micrometers in diameter were produced from a printhead having a 50 micrometer orifice diameter at a rate of 250 Hz with a velocity of 1.8 meters per second. Frequencies of 0–1 kHz have been used with said solder. Frequencies in the range of 0–2 kHz have been demonstrated with pure indium. With the device scaled two times in diameter, that is to say with a 100 micrometer orifice diameter, solder balls of 120 micrometers have been created at a frequency of 250 Hz at a velocity of 1.8 meters per second. The larger diameter solder balls or drops are sometimes preferred in the microelectronics industry.

Although the invention has been described with particular reference to presently preferred embodiments thereof, various modifications, alterations, variations, etc., may be made without departing from the spirit and scope of the invention as defined by the appended claims.

I claim:

1. A compact printhead assembly adapted to operate without confinement in a controlled atmosphere chamber, the printhead being configured to eject liquid solder droplets onto a workpiece through its own controlled atmosphere designed to inhibit oxidation of the ejected droplets in a space between a working surface at one end of the printhead assembly and the workpiece, the assembly comprising:

a heated housing having a reservoir for holding melted solder and an end having a working surface, the housing having a heating means;

the working surface being spaced apart from the reservoir by a portion of the housing containing an internal cavity extending from the reservoir to the working surface;

a solder jetting device positioned within the internal cavity of said portion of the housing, said jetting device being adapted to controllably eject droplets of melted liquid solder received from the reservoir in the housing, the jetting device comprising an electro-mechanical transducer in contact with an elongated conduit having an inlet end in communication with the melted solder and an outlet end having an exit orifice positioned adjacent said working surface, configured to emit said solder droplets outwardly away from said working surface;

said working surface being a generally flat surface surrounding the outlet of the solder jetting device extending laterally a sufficient distance to confine a blanket of flowing inert gas within a gap established between the working surface and said workpiece; and means for uniformly distributing a flow of inert gas around the exit orifice whereby said gas flows outwardly from the working surface, traversing said gap established between the working surface and a workpiece when the printhead is positioned for soldering use over a workpiece in order to provide a sufficient protective atmosphere around solder droplets emitted from the exit orifice by the jetting device to permit solder deposition without damaging oxidation.

2. The printhead assembly of claim 1 wherein said housing has an upper portion containing the reservoir, an upper end having an opening into the reservoir and a removable closure for the opening.

3. The printhead assembly of claim 1 further including a filter in a molten solder pathway in fluid communication with the reservoir, before the jetting device, by which undissolved matter can be prevented from reaching the exit orifice.

4. The printhead assembly of claim 1 wherein the jetting device comprises a piezoelectric transducer in contact with the conduit.

5. The printhead assembly of claim 1 wherein the piezoelectric transducer has a tubular configuration which circumscribes a portion of said conduit.

6. The printhead assembly of claim 1 wherein said gap is on the order of two millimeters with an oxygen content of about 100 or less measured as parts per million in the gap near the exit orifice.

7. The printhead assembly of claim 1 wherein said oxygen content is about 200 parts per million or less.

8. A compact printhead assembly adapted to operate without confinement in a controlled atmosphere chamber, the printhead being configured to eject liquid solder droplets onto a workpiece through its own controlled atmosphere designed to inhibit oxidation of the ejected droplets in a space between a working surface at one end of the printhead assembly and the workpiece, the assembly comprising:

a heated housing having a reservoir for holding melted solder and an end having a working surface, the housing having a heating means, said housing having an upper portion containing the reservoir, an upper end having an opening into the reservoir and a removable closure for the opening;

the working surface being spaced apart from the reservoir by a portion of the housing containing an internal cavity extending from the reservoir to the working surface;

a solder jetting device positioned within the internal cavity of said portion of the housing, said jetting device being adapted to controllably eject droplets of melted liquid solder received from the reservoir in the housing, the jetting device comprising an electro-mechanical transducer in contact with an elongated conduit having an inlet end in communication with the melted solder and an outlet end having an exit orifice positioned adjacent said working surface, configured to emit said solder droplets outwardly away from said working surface;

said upper portion of the housing has means for introducing pressurized inert gas and vacuum to the upper part of the reservoir whereby above atmospheric pressure gas or vacuum can be applied above a charge of melted solder in the reservoir to help adjust the output of the solder jetting device;

means for uniformly distributing a flow of inert gas around the exit orifice whereby said gas flows outwardly from the working surface, traversing a gap established between the working surface and a workpiece when the printhead is positioned for soldering use over a workpiece in order to provide a sufficient protective atmosphere around solder droplets emitted from the exit orifice by the jetting device to permit solder deposition without damaging oxidation.

9. A compact printhead assembly adapted to operate without confinement in a controlled atmosphere chamber, the printhead being configured to eject liquid solder droplets onto a workpiece through its own controlled atmosphere designed to inhibit oxidation of the ejected droplets in a space between a working surface at one end of the printhead assembly and the workpiece, the assembly comprising:

a heated housing having an upper portion containing a reservoir for holding melted solder and an end having a working surface, the housing having a heating means;

the working surface being spaced apart from the reservoir by a portion of the housing containing an internal cavity extending from the reservoir to the working surface;

a solder jetting device positioned within the internal cavity of said portion of the housing, said jetting device being adapted to controllably eject droplets of melted liquid solder received from the reservoir in the housing, the jetting device comprising an electro-mechanical transducer in contact with an elongated conduit having an inlet end in communication with the melted solder and an outlet end having an exit orifice positioned adjacent said working surface, configured to emit said solder droplets outwardly away from said working surface;

means for uniformly distributing a flow of inert gas around the exit orifice whereby said gas flows outwardly from the working surface, traversing a gap established between the working surface and a workpiece when the printhead is positioned for soldering use over a workpiece in order to provide a sufficient protective atmosphere around solder droplets emitted from the exit orifice by the jetting device to permit solder deposition without damaging oxidation; and the upper portion of the housing includes a means for preheating inert gas, said means including a supply inlet for connection to a supply of inert gas and an outlet in communication with the means for uniformly distributing a flow of inert gas whereby heated inert gas is distributed around the exit orifice of the jetting device during a soldering operation.

10. The printhead assembly of claim 9 wherein the means for preheating inert gas comprises, in thermal transfer contact with the housing, a lengthy tortuous path through which the inert gas must pass while flowing between the supply inlet and the outlet thereby increasing residence time of the inert gas in contact with the heated upper portion of the housing and the temperature of the gas thereby.

11. The printhead assembly of claim 10 wherein the upper portion of the housing has an outer surface and at least one plate having an inner surface in contact with said outer surface, the tortuous path being a serpentine groove located between said inner and outer surfaces.

12. The printhead assembly of claim 11 wherein said at least one plate comprises a plurality of plates in an angular relation to each other wherein the serpentine groove is carried on from plate to plate to create the tortuous path.

13. A compact printhead assembly adapted to operate without confinement in a controlled atmosphere chamber, the printhead being configured to eject liquid solder droplets onto a workpiece through its own controlled atmosphere designed to inhibit oxidation of the ejected droplets in a space between a working surface at a lower end of the printhead assembly and the workpiece, the assembly comprising:

a heated housing having a reservoir for holding melted solder and a lower end having a working surface, the housing having a heating means;

the working surface being spaced apart from the reservoir by a portion of the housing containing an internal cavity extending from the reservoir to the working surface;

a solder jetting device positioned within the internal cavity of said portion of the housing, said jetting device being adapted to controllably eject droplets of melted liquid solder received from the reservoir in the housing, the jetting device comprising an electro-mechanical transducer in contact with an elongated conduit having an inlet end in communication with the melted solder and an outlet end having an exit orifice positioned adjacent said working surface, configured to emit said solder droplets outwardly away from said working surface;

the elongated conduit of the jetting device extends generally longitudinally within the housing in generally right angle relationship with the working surface at the lower end of the printhead assembly, the working surface being extended radially a sufficient distance in all directions from the exit orifice to confine a flowing blanket of inert gas, provided by a means for uniformly distributing a flow of inert gas around the exit orifice when the working surface is positioned within a working distance of a workpiece;

means for uniformly distributing a flow of inert gas around the exit orifice whereby said flowing gas flows outwardly from the working surface, traversing a gap established between the working surface and a workpiece when the printhead is positioned for soldering use a working distance over a workpiece in order to provide a sufficient protective atmosphere around solder droplets emitted from the exit orifice by the jetting device to permit solder deposition without damaging oxidation.

14. The printhead assembly of claim 13 further including a particulate filter located in a molten solder pathway in fluid communication with the reservoir through which molten solder can reach the solder jetting device without contamination with undissolved matter.

15. The printhead assembly of claim 12 wherein the means for uniformly distributing said flow of inert gas around the exit orifice comprises an annular opening spaced uniformly around the exit orifice at the working surface through which said flow of inert gas is discharged.

16. The printhead assembly of claim 15 wherein the means for uniformly distributing said flow of inert gas around the exit orifice is further defined as a cone shaped formation which establishes an annular chamber leading outwardly to said annular opening, said annular chamber being provided with an internal opening leading to an inlet connection for supplying the inert gas.

17. The printhead assembly of claim 16 wherein said cone shaped formation comprises a cap with an inner cone surface which fits over a corresponding cone surface on the lower end of the housing, a flat circular shaped surface at the outer end of the cone surface formed on the housing and an opening in the cap which surrounds the flat circular shaped surface, jointly forming said annular opening and chamber, the outer surfaces of said flat circular shaped surface and said cap comprising respectively first and second portions of said working surface.

18. The printhead assembly of claim 17 wherein said second portion of the working surface extends slightly a distance beyond said first portion of the working surface and said exit orifice is positioned even with the level of the first portion of the working surface.

19. The printhead assembly of claim 18 wherein the cap has a plurality of grooves in the second working surface radiating from the exit orifice to facilitate viewing of the solder droplet formation process.

20. The printhead assembly of claim 13 wherein the means for uniformly distributing said flow of inert gas around the exit orifice comprises at least first and second concentric annular openings spaced uniformly around the exit orifice at the working surface through which said inert gas is discharged, said first and second annular openings being respectively spaced a first and second radial distance from said exit orifice, where said second distance is greater than said first distance.

21. The printhead assembly of claim 20 wherein the means for uniformly distributing a flow of inert gas around the exit orifice comprises two such means wherein a first such means distributes gas through said first annular opening and a second such means distributes gas through said second annular opening whereby a different inert gas or the same inert gas can be distributed at the same or a different flow rate from each annular opening.

22. The printhead assembly of claim 13 wherein the jetting device comprises a piezoelectric transducer in a tubular configuration which surrounds a portion of the conduit in contact therewith.

23. A process for depositing soldering workpieces without the necessity of confining the whole workpiece in an inert atmosphere chamber, comprising:

providing a compact liquid solder printhead having a housing with a means for heating the housing above the melting temperature of solder, the housing having an upper portion and a lower portion wherein the upper portion has a reservoir with a removable closure for holding melted solder, the lower portion having a lower end with a working surface and an internal cavity extending between the working surface and the reservoir;

providing an elongated solder jetting device within said cavity, said device having an upper end communicating with the reservoir through a passageway for liquid solder, a controllable electro-mechanical transducer connected to a solder droplet emitting tube having a lower end with an exit orifice located at the working surface, the solder jetting device being adapted to emit tiny solder droplets from the exit orifice at the working surface and direct them toward a workpiece, providing a means for uniformly distributing a flow of inert gas around the exit orifice at the working surface and a low pressure source of inert gas to be distributed;

heating the printhead to a temperature sufficient to melt and hold a charge of liquid solder in the reservoir;

supplying a flow of inert gas to the lower portion of the printhead through the distributing means;

positioning the printhead working surface within a working distance of a workpiece to be soldered thereby simultaneously establishing a blanket of inert gas in an area defined by the working surface surrounding the exit orifice; and operating the solder jetting device to controllably eject droplets of melted liquid solder from the exit orifice and directing them to a soldering position on the workpiece while maintaining the blanket of inert gas between the workpiece and the working surface, to solder without damaging oxidation.

24. The process of claim 23 further comprising:

providing a pressure controlled source of inert gas to the reservoir above a charge of melted solder; and controlling the pressure of the inert gas applied to the reservoir to help adjust the output of the solder jetting device for a desired solder droplet output.

25. The process of claim 23 wherein the step of providing an elongated solder jetting device comprises the controllable electromechanical transducer being a piezoelectric transducer.

26. The process of claim 25 wherein said step of operating the solder jetting device includes the step of applying a bias voltage to the piezoelectric transducer sufficient to prevent depoling resulting from operation at elevated temperature.

27. The process of claim 26 wherein the step of operating said solder jetting device comprises applying a waveform pulse which opposes but does not generally exceed said bias voltage.

28. The process of claim 25 wherein said step of operating the solder jetting device includes the step of applying a bias voltage to the piezoelectric transducer sufficient to prevent depoling resulting from operation at elevated temperature.

29. The process of claim 28 wherein the step of operating said solder jetting device comprises applying a waveform pulse which opposes but does not generally exceed said bias voltage.

30. A process for depositing solder on workpieces without the necessity of confining the whole workpiece in an inert atmosphere chamber, comprising:

providing a compact liquid solder printhead having a housing with a means for heating the housing above the melting temperature of solder, the housing having an upper portion and a lower portion wherein the upper portion has a reservoir with a removable closure for holding melted solder, the lower portion having a lower end with a working surface and an internal cavity extending between the working surface and the reservoir;

providing a jacket around a portion of the printhead housing, having an inert gas supply inlet and an outlet for the inert gas with a tortuous path through which the inert gas must travel between the supply inlet and the outlet whereby the inert gas is heated by the housing;

providing an elongated solder jetting device within said cavity, said device having an upper end communicating with the reservoir through a passageway for liquid solder, a controllable electro-mechanical transducer connected to a solder droplet emitting tube having a lower end with an exit orifice located at the working surface, the solder jetting device being adapted to emit tiny solder droplets from the exit orifice at the working surface and direct them toward a workpiece;

providing a means for uniformly distributing a flow of inert gas around the exit orifice at the working surface and a low pressure source of inert gas to be distributed;

heating the printhead to a temperature sufficient to melt and hold a charge of liquid solder in the reservoir;

supplying a flow of inert gas to the lower portion of the printhead through the distributing means by transferring said heated inert gas from said outlet while soldering to help prevent premature freezing of solder droplets emitted;

positioning the printhead working surface within a working distance of a workpiece to be soldered thereby simultaneously establishing a blanket of inert gas in an area defined by the working surface surrounding the exit orifice; and operating the solder jetting device to controllably eject droplets of melted liquid solder from the exit orifice and directing them to a soldering position on the workpiece while maintaining the blanket of inert gas between the workpiece and the working surface, to solder without damaging oxidation.

31. In a print head assembly for solder deposition with liquid metals, of the type having a housing containing a jetting device having a conduit for liquid metals, the conduit having a tip with a fine exit opening and an electromechanical transducer surrounding part of said conduit, the conduit being connected to a source of liquid metal, the jetting device being operable by means of a controller sending a signal operable to repeatedly contract the electro-mechanical transducer and thereby cause solder droplets to be emitted from the tip of the conduit, the improvement comprising:

the housing having a self-contained supply reservoir for liquid metal which is fluidly connected to the conduit;

heating means in the housing to maintain the supply reservoir and jetting device at a liquid metal temperature;

the housing having an end with a working surface at which the tip is located; and a means for distributing inert gas from the working surface around the tip into a gap created by placing the working surface in close proximity a working distance from a substrate surface whereby the inert gas flows radially outwardly along the working surface through the gap thereby excluding sufficient oxygen from the gap to allow microdroplets of solder to be formed and deposited on the substrate without harmful oxidation.

* * * * *